United States Patent
Xu et al.

(10) Patent No.: US 10,700,302 B2
(45) Date of Patent: Jun. 30, 2020

(54) DISPLAY SUBSTRATE AND OLED DISPLAY DEVICE

(71) Applicants: BOE Technology Group Co., Ltd., Beijing (CN); Hefei BOE Optoelectronics Technology Co., Ltd., Hefei (CN)

(72) Inventors: Zhaozhe Xu, Beijing (CN); Ji Li, Beijing (CN)

(73) Assignees: BOE Technology Group Co., Ltd., Beijing (CN); Hefei BOE Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 15/580,340

(22) PCT Filed: May 10, 2017

(86) PCT No.: PCT/CN2017/083710
§ 371 (c)(1),
(2) Date: Dec. 7, 2017

(87) PCT Pub. No.: WO2017/198094
PCT Pub. Date: Nov. 23, 2017

(65) Prior Publication Data
US 2018/0175318 A1    Jun. 21, 2018

(30) Foreign Application Priority Data

May 16, 2016  (CN) .......................... 2016 1 0321651

(51) Int. Cl.
*H01L 51/52*  (2006.01)
*H01L 27/32*  (2006.01)
*G09F 9/33*   (2006.01)

(52) U.S. Cl.
CPC ............ *H01L 51/5218* (2013.01); *G09F 9/33* (2013.01); *H01L 27/32* (2013.01);
(Continued)

(58) Field of Classification Search
None
See application file for complete search history.

(56) References Cited

U.S. PATENT DOCUMENTS 6,833,668 B1 * 12/2004 Yamada .............. H01L 51/5246
                                                         313/505
8,169,140 B2    5/2012  Han
(Continued)

FOREIGN PATENT DOCUMENTS

CN          1454032 A     11/2003
CN        101330095 A     12/2008
(Continued)

OTHER PUBLICATIONS

Jul. 27, 2017—(WO) International Search Report and Written Opinion Appn PCT/CN2017/083710 with English Tran.
(Continued)

*Primary Examiner* — Walter H Swanson
*Assistant Examiner* — Kien C Ly
(74) *Attorney, Agent, or Firm* — Banner & Witcoff, Ltd.

(57) ABSTRACT

A display substrate and an OLED display device, the display substrate including a water absorbing structure disposed on the display substrate that is configured to be capable of absorbing moisture in the display substrate. In the embodiments of the present invention, by providing a water absorbing structure in the display substrate, it is possible to protect the organic luminescent unit from moisture released in the process of manufacturing and operating the display substrate, enhance the performance of the OLED display device and prolong the service life of the OLED display device.

4 Claims, 2 Drawing Sheets

(52) U.S. Cl.
CPC ...... *H01L 51/5259* (2013.01); *H01L 27/3246* (2013.01); *H01L 51/525* (2013.01)

(56) References Cited

U.S. PATENT DOCUMENTS

| | | | |
|---|---|---|---|
| 9,478,769 | B2 | 10/2016 | Jiao et al. |
| 2001/0028060 | A1* | 10/2001 | Yamazaki ............ G09G 3/3233 257/72 |
| 2001/0030730 | A1* | 10/2001 | Iwanaga ............... G02F 1/1339 349/153 |
| 2004/0012332 | A1 | 1/2004 | Sasatani et al. |
| 2008/0315755 | A1* | 12/2008 | Han ..................... H01L 51/525 313/504 |
| 2014/0167012 | A1 | 6/2014 | Sun et al. |
| 2015/0287770 | A1* | 10/2015 | Sato ................... H01L 27/3246 257/40 |
| 2015/0340655 | A1 | 11/2015 | Lee et al. |
| 2016/0190514 | A1* | 6/2016 | Masuda ............. H01L 51/5259 257/40 |
| 2016/0260785 | A1 | 9/2016 | Jiao |
| 2017/0005148 | A1* | 1/2017 | Kwon ................. H01L 27/3246 |

FOREIGN PATENT DOCUMENTS

| | | |
|---|---|---|
| CN | 103022378 A | 4/2013 |
| CN | 103840087 A | 6/2014 |
| CN | 103972267 A | 8/2014 |
| CN | 104956510 A | 9/2015 |
| CN | 105826357 A | 8/2016 |
| JP | H1154285 A | 2/1999 |

OTHER PUBLICATIONS

Apr. 16, 2018—(CN) First Office Action 201610321651.X with English Translation.

Nov. 1, 2018—(CN) Second Office Action Appn 201610321651.X with English Translation.

\* cited by examiner

DISPLAY SUBSTRATE AND OLED DISPLAY DEVICE

The application is a U.S. National Phase Entry of International Application No. PCT/CN2017/083710 filed on May 10, 2017, designating the United States of America and claiming priority to Chinese Patent Application No. 201610321651.X, filed on May 16, 2016. The present application claims priority to and the benefit of the above-identified applications and the above-identified applications are incorporated by reference herein in their entirety.

TECHNICAL FIELD

The present disclosure relates to a display substrate and an OLED display device.

BACKGROUND

Since Organic Light-Emitting Diodes (OLEDs) have advantages of simple structure, fast response speed, low power consumption and self-luminous, display devices manufactured with OLEDs have excellent display performance.

SUMMARY

An embodiment of the present disclosure provides a display substrate, comprising a water absorbing structure disposed on the display substrate, the water absorbing structure being configured to be capable of absorbing moisture in the display substrate.

In an embodiment of the present disclosure, for example, the water absorbing structure comprises at least one functional layer in the display substrate and the at least one functional layer contains a desiccant.

In an embodiment of the present disclosure, for example, the at least one functional layer comprises a spacer in the display substrate.

In an embodiment of the present disclosure, for example, the display substrate comprises a display area, and the spacer is disposed in the display area.

In an embodiment of the present disclosure, for example, the display substrate comprises a pixel definition layer, and the spacer is disposed on the pixel definition layer.

In an embodiment of the present disclosure, for example, the at least one functional layer comprises a pixel definition layer of the display substrate.

In an embodiment of the present disclosure, for example, the desiccant is physical adsorption particles.

In an embodiment of the present disclosure, for example, the desiccant is nanometer silica gel particles.

In an embodiment of the present disclosure, for example, a volume concentration of the desiccant in the at least one functional layer is from 1% to 8%.

In an embodiment of the present disclosure, for example, the at least one functional layer comprises a spacer and a pixel definition layer of the display substrate.

An embodiment of the present disclosure provide an OLED display device, comprising the above described display substrate.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one.

Figure 1:
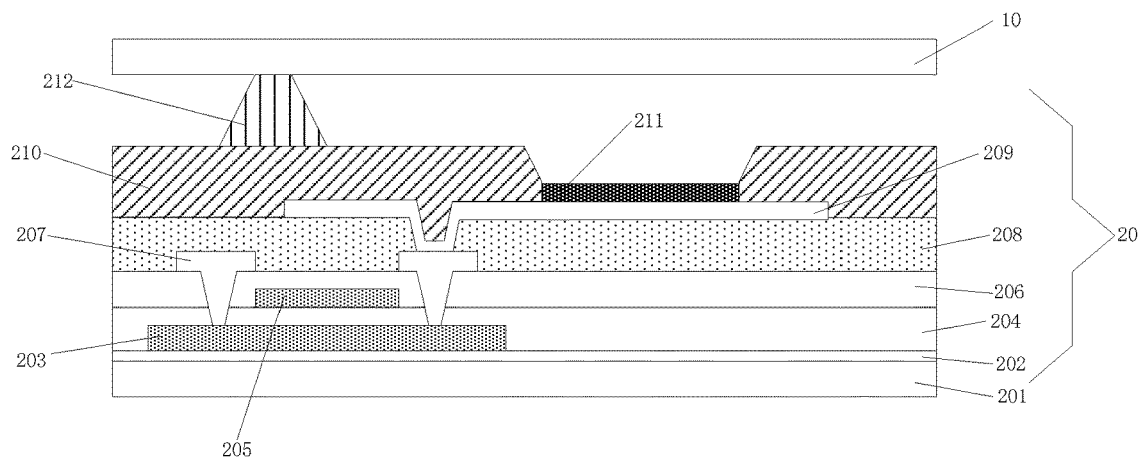
FIG. 1 is a structure diagram of a conventional display substrate.

As shown in FIG. 1, an OLED display device generally comprises an encapsulation substrate 10 and a display substrate 20, wherein the display substrate 20 comprises a base substrate 201, a buffer layer 202 and a polysilicon layer 203 formed on the base substrate 201, an insulating layer 204 covering the polysilicon layer 203, a gate electrode 205 and a gate insulating layer 206 formed on the insulating layer 204, a source/drain electrode 207 formed on the gate insulating layer 206, a protection layer 208 covering the source/drain electrode 207, a reflective anode 209 and a pixel definition layer 210 formed on the protection layer 208, an organic luminescent unit 211 surrounded by the pixel definition layer 210, and a spacer 212 formed on the pixel definition layer 210.

Since the organic luminescent material in the organic luminescent unit 211 is very sensitive to moisture, the presence of trace moisture would cause severe degradation or even complete failure of light emission quality. Therefore, very low moisture content must be kept inside the OLED display device, which is generally realized by engaging and then sealing the encapsulation substrate 10 and the display substrate 20 in a vacuum environment. However, such an encapsulation technology can only prevent external moisture from intruding, and has no blocking effect for moisture already adsorbed in the layer structure of the display substrate 20 before the encapsulation. The moisture adsorbed in these layer structures, particularly the pixel definition layer will be released in subsequent manufacturing and operation process of the display substrate and will influence the performance of the organic luminescent unit 211, resulting in severe degradation or even complete failure of light emission quality, and in turn impacting the light emission performance of the OLED device and shortening the service life of the OLED device.

An embodiments of the present invention provides a display substrate including a water absorbing structure (drying structure) disposed on the display substrate that may absorb moisture in the display substrate.

For example, the water absorbing structure may be a drying layer capable of absorbing moisture disposed on the display substrate, or may be formed by adding desiccants in a layer structure existing in the display substrate.

In the above-mentioned first case, namely disposing a special drying layer on the display substrate, the drying layer may be disposed at any position on the display substrate, for example, other existing functional layers.

Figure 2:
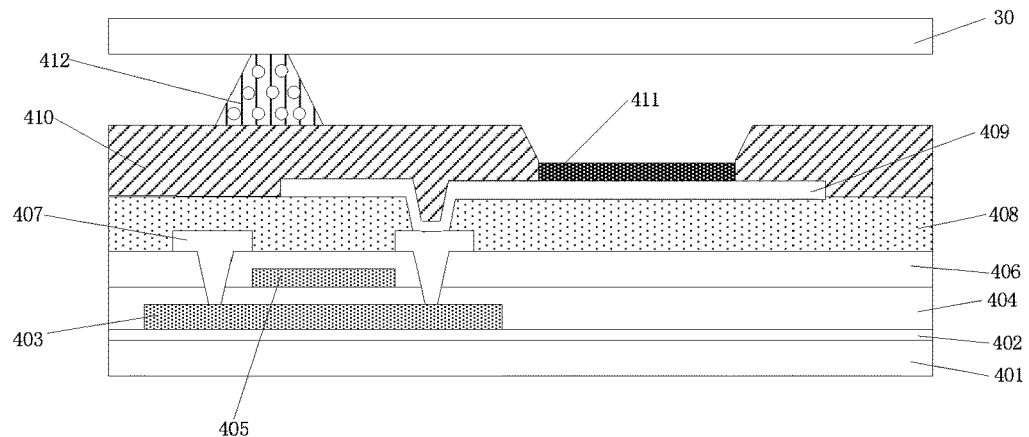
FIG. 2 is a structure diagram of a display substrate provided in an embodiment of the present invention.
Figure 3:
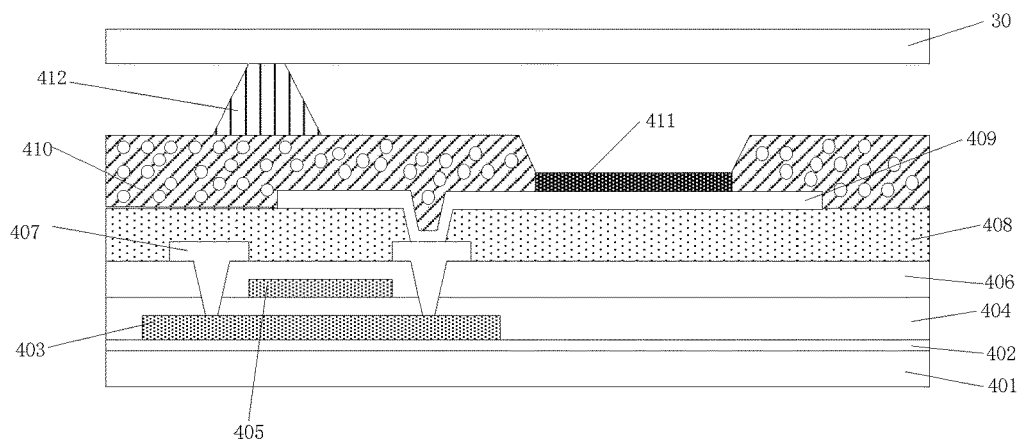
FIG. 3 is a structure diagram of a display substrate provided in another embodiment of the present invention.

In the above-mentioned second case, the water absorbing structure is one or more functional layers of the display substrate such as a spacer, the pixel definition layer and the insulating layer. In this approach, an existing structure on the display substrate is directly used, thereby omitting the additionally disposed water absorbing structure, which realizes the effect of absorbing moisture on the display substrate without increasing the overall thickness of the display substrate. For example, as shown in FIG. 2, the water absorbing structure may be a spacer in the display substrate that is added with desiccant. As shown in FIG. 3, the water absorbing structure may also be the pixel definition layer in the display substrate that is added with desiccant.

In embodiments of the present invention, by providing a water absorbing structure in the display substrate, moisture released during the manufacturing and operation process of the display substrate is absorbed by the water absorbing structure, which reduces the influence of moisture in the display substrate on the organic luminescent unit, improves the performance of the OLED display device and prolongs the service life of the OLED display device.

An embodiment of the present invention provides a display substrate. Referring to FIGS. 2 and 3, the display substrate comprises a base substrate 401, a buffer layer 402 and a polysilicon layer 403 formed on the base substrate 401, an insulating layer 404 covering the polysilicon layer 403, a gate electrode 405 and a gate insulating layer 406 formed on the insulating layer 404, a source/drain electrode 407 formed on the gate insulating layer 406, a protection layer 408 covering the source/drain electrode 407, reflective anodes 409 and a pixel definition layer 410 formed on the protection layer 408, an organic luminescent unit 411 surrounded by the pixel definition layer 410 and spacers 412 formed on the pixel definition layer 410. The organic luminescent unit 411 and the pixel definition layer 410 are on a side of the reflective anodes 409 away from the protection layer 408. The spacers 412 are on a side of the pixel definition layer 410 away from the reflective anode 411 and in direct contact with the pixel definition layer 410, and the spacers 412 are configured to space the display substrate and an opposite substrate 30.

For example, the water absorbing structure is one or more functional layers in the display substrate which contain desiccant. The one or more functional layers are film or layer structures for realizing certain functions disposed on the display substrate. For example, with reference to FIGS. 2 and 3, the one or more functional layers may include spacers 412, the pixel definition layer 410 and the insulating layer 404.

Further, with reference to FIG. 2, for example, the functional layer includes a spacer 412.

The spacer 412 is mixed with desiccant therein. The desiccant may be physical adsorption desiccant or chemical adsorption desiccant, which is not limited in embodiments of the present invention. Since the moisture absorbed in physical adsorption particles may be released in high temperature baking processes, which facilitates subsequent further adsorption of moisture, physical adsorption particles are preferably selected as the desiccant.

A water absorbing structure may be obtained by adding desiccant into spacers that are already present in the display substrate. In this case, the purpose of absorbing moisture in the display substrate is realized without adding any extra structures. Such a structure is easy to implement and convenient to manufacture.

Further, with reference to FIG. 2, the spacers 412 are disposed in the display area of the display substrate. The spacer 412 doped with desiccant is disposed in the display area of the display substrate such that the desiccant in the spacer 412 may absorb moisture in the display area of the display substrate to further reduce influence of the moisture on the organic luminescent unit 411 in the display area.

For example, with reference to FIG. 2, the display substrate includes a pixel definition layer 410 on which the spacers 412 is disposed. Since in the structure of the display substrate, the pixel definition layer 410 generally has a large thickness in which much moisture may be absorbed, and the pixel definition layer 410 is adjacent to the organic luminescent unit 411, much moisture in the pixel definition layer 410 would enter the organic luminescent unit 411 in the manufacturing and operation process of the display substrate, thereby influencing the light emission performance of the organic luminescent unit 411. Spacers 412 doped with desiccant are disposed on the pixel definition layer 410 such that much moisture in the pixel definition layer 410 will be absorbed by the desiccant in spacers 412, thereby further reducing influence of moisture on the organic luminescent unit 411.

Further, as shown in FIG. 3, the functional layer includes the pixel definition layer 410 in the display substrate. By adding desiccant into the pixel definition layer 410 that already exists in the display substrate to constitute a water absorbing structure, the purpose of absorbing moisture in the display substrate is realized simply and conveniently without adding any extra structure. Since the pixel definition layer 410 in the display substrate has a large thickness and absorbs much moisture, the desiccant is doped in the pixel definition layer 410 such that the desiccant may absorb moisture in the pixel definition layer 410 more directly and conveniently to reduce influence of moisture on the organic luminescent unit 411.

Figure 4:
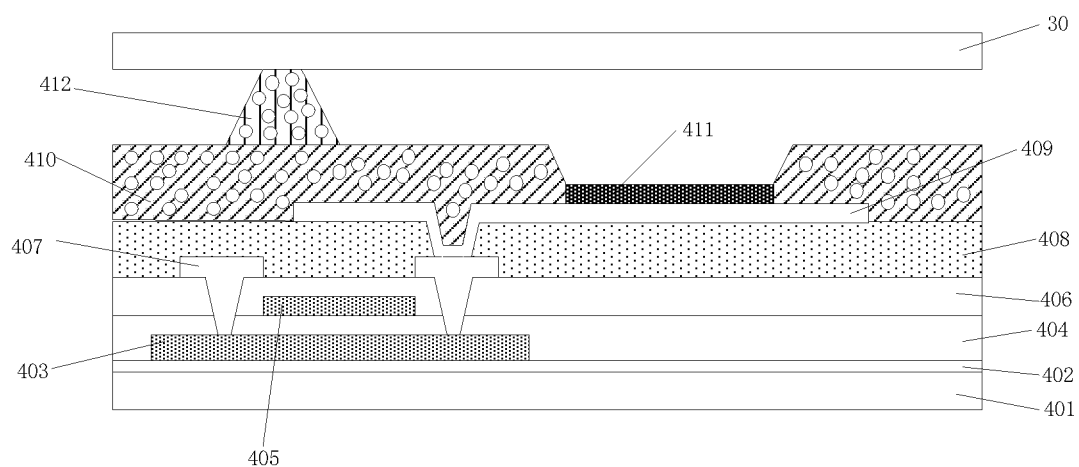
FIG. 4 is a structure diagram of a display substrate provided in yet another embodiment of the present invention.

It is to be noted that, as shown in FIG. 4, it is also possible to dope desiccant both in the spacers 412 and the pixel definition layer 410, which may further enhance the moisture absorption capability of the water absorbing structure and reduce the influence of moisture on the organic luminescent unit 411.

For example, since silica gel particles have a good moisture absorption effect and a steady property and are easy to obtain, silica gel particles may be selected as the desiccant. Furthermore, in order to dope silica gel particles uniformly in spacers and adapt to the manufacturing process of layer structures of the display substrate, the silica gel particles should not have large size, which is generally on the nanometer order. That is, the size of the silica gel particles is from 1 nm to 100 nm. For example, the desiccant is nanometer silica gel particles.

Optionally, the mixture concentration of desiccant in the functional layer is from 1% to 8%. For example, when the functional layer is the spacers, the volume ratio of desiccant in the spacers to the spacers is from 1% to 8%. Alternatively, when the functional layer is the pixel definition layer, the volume ratio of the desiccant in the pixel definition layer to the pixel definition layer is from 1% to 8%. In view of the content of moisture absorbed in the display substrate and the manufacturing process of layer structures in the display substrate, generally, the concentration of desiccant mixed in the functional layers is controlled to be from 1% to 8% to obtain a good absorption effect.

Another embodiment of the present invention provides an OLED display device including any one of the above-mentioned display substrates. The display device may be a display panel, a display, a cell phone, a TV set, a notebook computer or an all-in-one computer. Other indispensable constituents for the display device are all those understood to have by one skilled in the art, which will not be described any more herein nor serve as any limitation to the present invention.

It is to be noted that the display substrate mainly refers to the array substrate in embodiments of FIGS. 2 and 3. However, the display substrate may also be an encapsulation substrate or a color filter substrate. For example, in an OLED display device, the display substrate may be an array substrate or an encapsulation substrate. In a LCD, the display substrate may be an array substrate or a color filter substrate.

As compared to a conventional display substrate, with embodiments of the present invention, by providing a water absorbing structure in the display substrate, moisture released during the manufacturing and operation process of the display substrate is absorbed with the water absorbing structure, which reduces the influence of moisture in the display substrate on the organic luminescent unit, improves the performance of the OLED display device and prolongs the service life of the OLED display device.

What are described above is related to the illustrative embodiments of the disclosure only and not limitative to the scope of the disclosure; the scopes of the disclosure are defined by the accompanying claims.

The present application claims the priority of the Chinese Patent Application No. 201610321651.X filed on May 16, 2016, which is incorporated herein by reference as part of the disclosure of the present application.

What is claimed is:

1. A display substrate, comprising a water absorbing structure, the water absorbing structure being configured to be capable of absorbing moisture in the display substrate, wherein the water absorbing structure is formed by a pixel definition layer of the display substrate, the pixel definition layer contains a desiccant, the desiccant comprises nanometer silica gel particles, and a size of the nanometer silica gel particles is from 1 nm to 100 nm, the display substrate further comprising:
   a substrate;
   a buffer layer and a polysilicon layer, formed on the substrate;
   an insulating layer, covering the polysilicon layer;
   a gate electrode and a gate insulating layer, formed on the insulating layer;
   a source/drain electrode, formed on the gate insulating layer;
   a protection layer, covering the source/drain electrode;
   a reflective anode, formed on the protection layer;
an organic luminescent unit, wherein the organic luminescent unit and the pixel definition layer are on a side of the reflective anode away from the protection layer, and wherein the organic luminescent unit is surrounded by the pixel definition layer; and
a spacer, on a side of the pixel definition layer away from the reflective anode and in direct contact with the pixel definition layer, wherein the spacer is configured to space the display substrate and an opposite substrate.

2. The display substrate of claim 1, wherein a volume concentration of the desiccant is from 1% to 8%.

3. An organic light-emitting diode display device, comprising the display substrate of claim 2.

4. An organic light-emitting diode display device, comprising the display substrate of claim 1.

* * * * *